US009955575B1

United States Patent
Wang et al.

(10) Patent No.: US 9,955,575 B1
(45) Date of Patent: Apr. 24, 2018

(54) OUT OF PLANE STRUCTURES AND METHODS FOR MAKING OUT OF PLANE STRUCTURES

(71) Applicant: Palo Alto Research Center Incorporated, Palo Alto, CA (US)

(72) Inventors: Yu Wang, Palo Alto, CA (US); Christopher L. Chua, San Jose, CA (US); Qian Wang, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/651,311

(22) Filed: Jul. 17, 2017

(51) Int. Cl.
| | |
|---|---|
| *H05K 1/03* | (2006.01) |
| *H05K 1/18* | (2006.01) |
| *H01F 41/04* | (2006.01) |
| *H01F 27/28* | (2006.01) |
| *H05K 1/11* | (2006.01) |

(52) U.S. Cl.
CPC ....... *H05K 1/0393* (2013.01); *H01F 27/2804* (2013.01); *H01F 41/042* (2013.01); *H05K 1/11* (2013.01); *H05K 1/181* (2013.01); *H01F 2027/2809* (2013.01)

(58) Field of Classification Search
CPC .. H05K 1/0393; H05K 1/0313; H05K 1/0353; H05K 1/038
See application file for complete search history.

(56) References Cited

U.S. PATENT DOCUMENTS

| | | |
|---|---|---|
| 6,646,533 B2 | 11/2003 | Biegelson et al. |
| 7,000,315 B2 | 2/2006 | Chua et al. |
| 7,713,388 B2 | 5/2010 | Chua et al. |

*Primary Examiner* — Jeremy C Norris
(74) *Attorney, Agent, or Firm* — Hollingsworth Davis, LLC

(57) ABSTRACT

A three dimensional device comprises a substrate and a film comprising one or more stress engineered layers. The film includes elastic portions that are curled out of plane with respect to the substrate and anchor portions that attach the elastic portions and to the substrate. An outer conductive layer is disposed over the elastic portions and the anchor portions. The device includes one or more electrically conductive stubs that extend between two adjacent anchor portions without electrically connecting the two adjacent anchor portions.

23 Claims, 10 Drawing Sheets

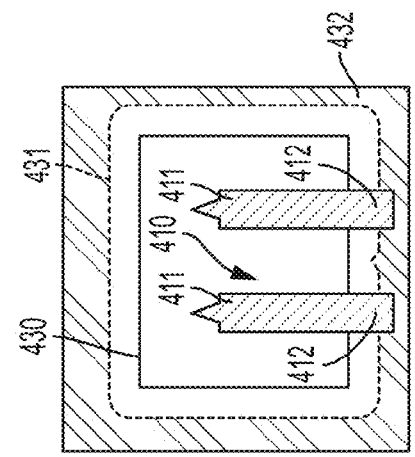
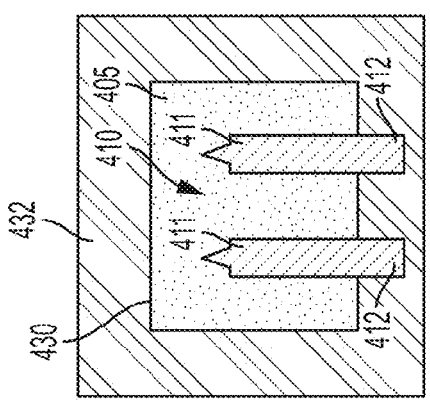
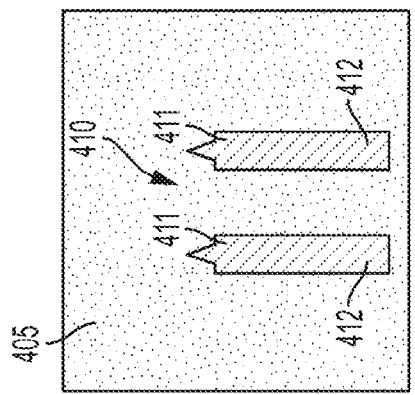
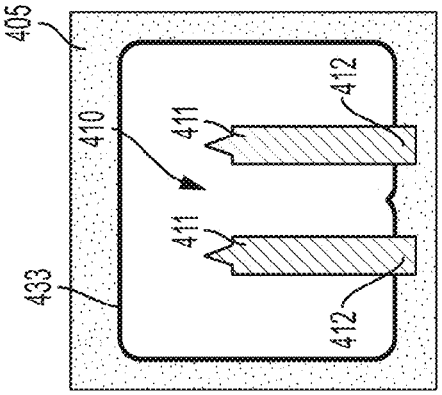
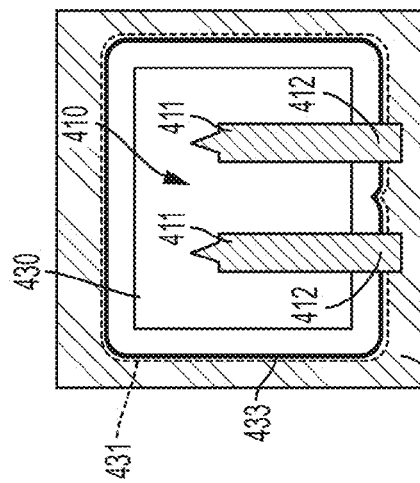
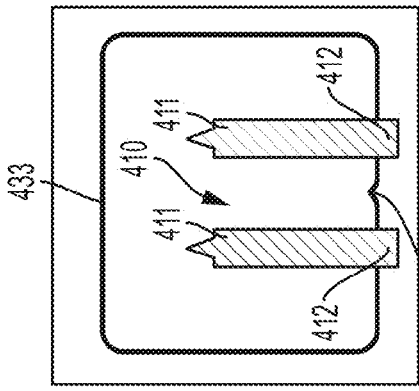

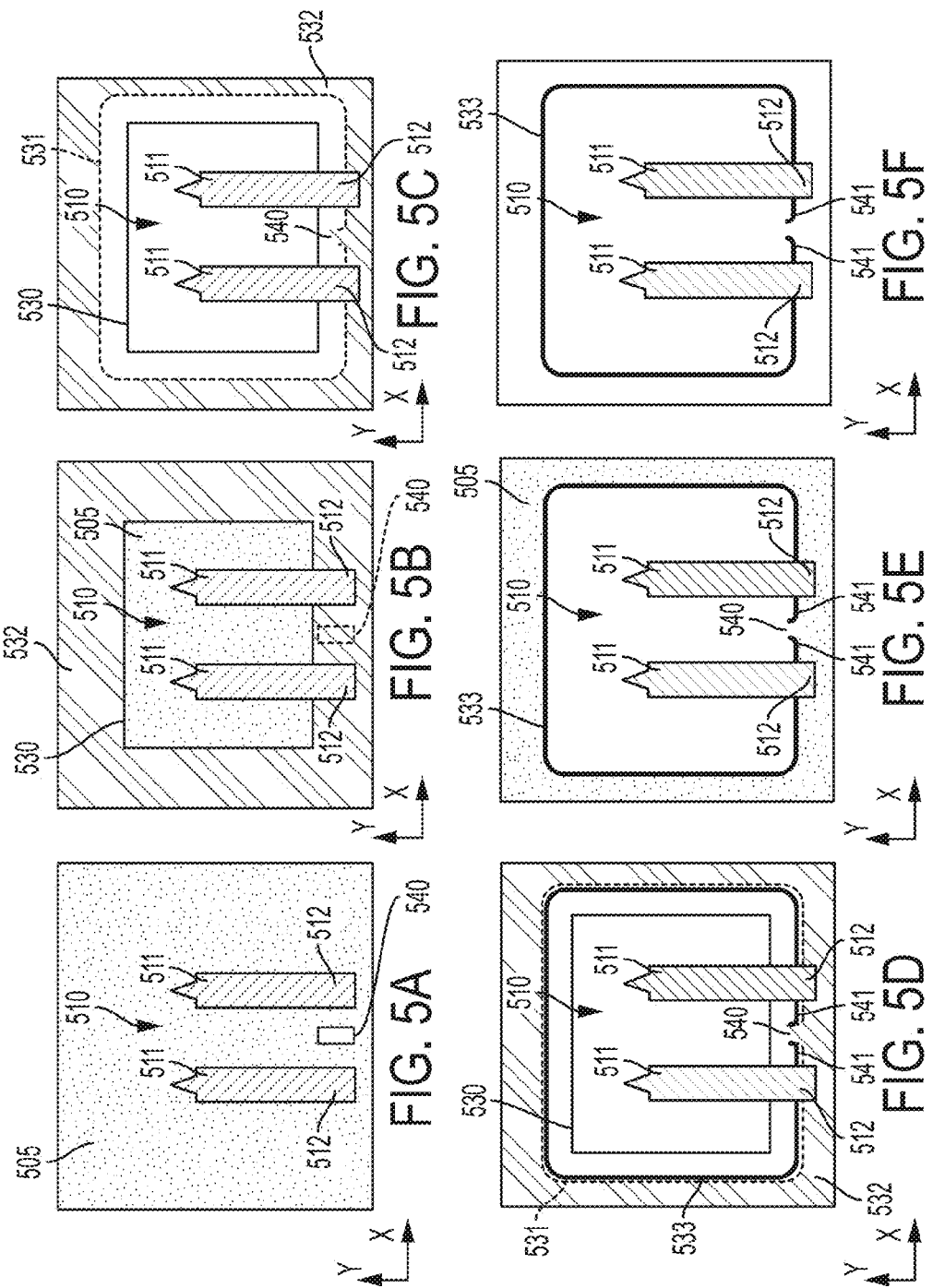

OUT OF PLANE STRUCTURES AND METHODS FOR MAKING OUT OF PLANE STRUCTURES

TECHNICAL FIELD

This disclosure relates generally to electrical micro-device structures and to methods for making such structures.

BACKGROUND

Out-of-plane structures, such as three dimensional coils, offer several advantages over in-plane structures. Out-of-plane coils place the coil axis parallel, rather than perpendicular, to the substrate plane. Additionally, out-of-plane coils reduce eddy currents induced in the underlying substrate, and when out-of-plane coils are operated at high frequencies, allow for better control of skin and proximity effects.

BRIEF SUMMARY

Some embodiments are directed to a method for forming a three dimensional structure. A stress engineered film is deposited over a conductive layer. The stress engineered film includes elastic portions having a non-uniform stress profile through the thickness of the one or more layers such that the stress engineered film curls when released from the conductive layer. The stress engineered film also includes anchor portions that remain attached to the conductive layer. Gaps are formed in the conductive layer between neighboring anchor portions. A mask layer that defines one or more release windows is deposited. The conductive layer is etched in the release windows. The etching of the conductive layer releases the elastic portions of the stress engineered film such that the elastic portions curl to form the three dimensional structure. The three dimensional structure is electroplated using the conductive layer as a contact for the electroplating.

Some embodiments involve a three dimensional device. The device includes a substrate and a film comprising one or more stress engineered layers. The film includes elastic portions that are curled out of plane with respect to the substrate and anchor portions that attach the elastic portions and to the substrate. An outer conductive layer is disposed over the elastic portions and the anchor portions. The device includes one or more electrically conductive stubs that extend between two adjacent anchor portions without electrically connecting the two adjacent anchor portions.

In accordance with some embodiments, a circuit system includes a circuit substrate and one or more electronic components. The system further includes an electrically conductive three dimensional structure electrically connected to at least one of the electronic components. The three dimensional structure comprises a film comprising one or more stress engineered layers. The film has elastic portions curled into a three dimensional shape and anchor portions that attach the elastic portions and to substrate. An outer conductive layer is disposed over the elastic portions and the anchor portions. One or more conductive stubs extend between two adjacent anchor portions without electrically connecting the two adjacent anchor portions.

These and other aspects of the present application will be apparent from the detailed description below. In no event, however, should the above summaries be construed as limitations on the claimed subject matter, which subject matter is defined solely by the attached claims.

BRIEF DESCRIPTION OF DRAWINGS

FIGS. 4A through 4F show a process sequence illustrating the formation of anchor plating shorts;

FIGS. 5A through 5F illustrate an approach for reducing or eliminating shorts between anchor portions that develop during electroplating in accordance with some embodiments.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments described herein are directed to out-of-plane structures and methods for making out of plane structures. In some embodiments the out-of-plane structures are coil structures comprising coil windings that self-assemble. The coil windings comprise electrically conductive elastic members that have an intrinsic stress profile. Coil windings are made by introducing an intrinsic stress profile of a certain amount into the elastic members that is designed to produce the desired coil winding height and curvature. A reproducible built-in stress gradient or intrinsic stress profile can be designed into a thin film by varying the growth conditions appropriately during deposition to produce coil windings, e.g., a released elastic member which bends back on itself producing a full or half coil winding. When released from the substrate, the elastic members curl to form out of plane coil windings due to their intrinsic stress profile. Optionally the curling can be controlled by load elements disposed on the elastic members. The electrically conductive coil windings may optionally be held in a spaced apart configuration by non-electrically conductive tethers that connect the coil windings. After the coil structures are self-formed in the manner described above, the coil structures are electroplated for electrical connection and/or to increase the electrical conductivity of the coil windings. The approaches described in this disclosure allow for fabrication of an out of plane, high Q factor micro-coil structure with Q factor greater than about 10 and adjacent coil windings that are separated by less than about 100 um. During operation, the three dimensional (3D) out-of-plane coil windings orient the magnetic field parallel to the substrate surface, resulting in low energy loss and high quality-factor performance.

The methods and structures disclosed herein employ some of the techniques disclosed in U.S. Pat. Nos. 7,713,388, 7,000,315, 6,856,225, 6,646,533, 6,392,524, 5,613,861, 5,848,685, and 5,914,218 which are all incorporated herein by reference. Coils or springs are made by introducing an intrinsic stress profile of a certain amount designed to provide the desired coil winding or spring height and/or curvature. A reproducible built-in stress profile can be designed into a thin film by varying the growth conditions appropriately during deposition to produce coil structures that are "self-assembling." Self-assembling coil structures include released elastic members which bend back on themselves producing coil windings. By using or adding one or more conductive layers, a coil structure suitable for use as an inductor or transformer may be manufactured.

Figure 1:
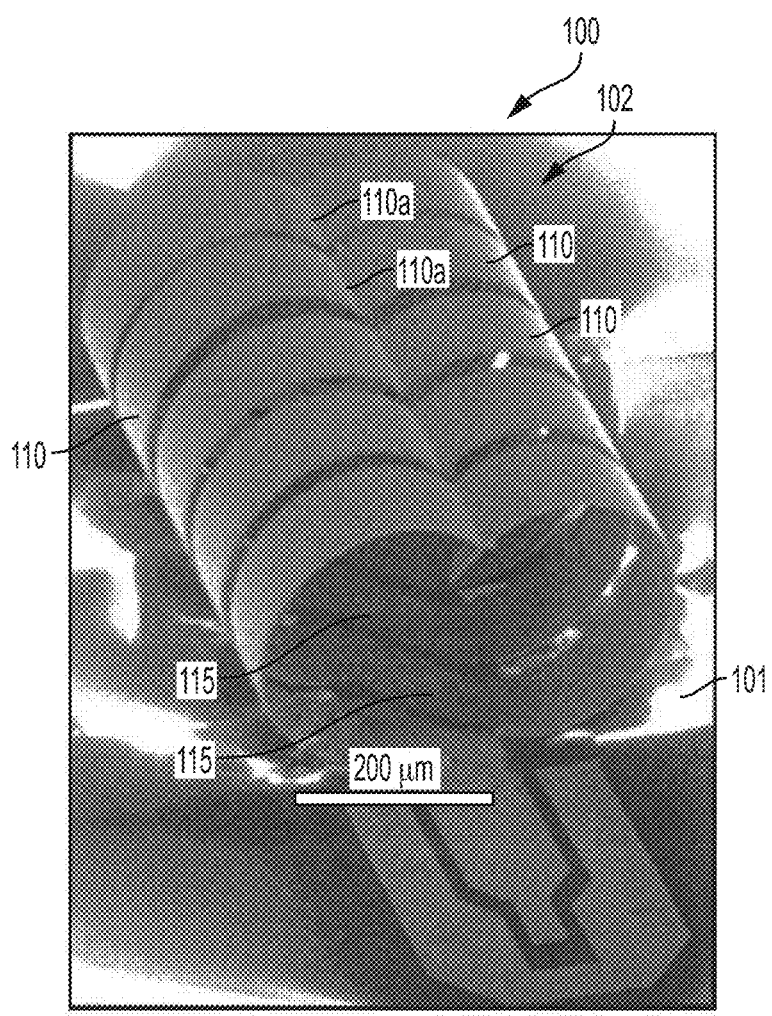
FIG. 1 is a scanning electron micrograph showing perspective view of a coil structure comprising a microfabricated on-chip 3D coil inductor in accordance with some embodiments.

FIG. 1 is a scanning electron micrograph showing a perspective view of a coil structure 100 comprising a microfabricated on-chip 3D coil inductor 102. The coil structure 100 comprises a substrate 101 and a coil 102 disposed on the substrate 101. Each coil winding 110 comprises an electrically conductive elastic material, that, as deposited, has an intrinsic stress profile which biases a free end of the coil winding 110 away from the substrate 101. The intrinsic stress at the free end relaxes as that released section of the elastic material curls away from the substrate. Each coil winding 110 is electrically connected to the substrate 101 by a respective anchor portion 115. The electroplated coil windings 110 are electrically connected together through the anchor portions 115. In some embodiments, the distance between the coil windings 110 is less than about 100 µm. In some embodiments, a ratio between a width of the coil windings 110 and the distance between the coil windings 110 is greater than about 2.

The coil structure 100 may be fabricated using standard wafer-scale processing techniques, and can be batch-fabricated on integrated circuit wafers as an add-on process. The coil 102 may be fabricated by depositing and subsequently releasing patterned stress-engineered thin films from the substrate 101. The released portions of the film curl up from opposite ends and self-assemble in air to form coil windings 110. The resulting three dimensional (3D) structure forms a scaffold that is then electroplated with highly conductive metal, such as Cu. In the example of FIG. 1, the plating process joins the seams 110a where two opposite coil windings meet. It also patches perforations on the coil windings employed for facilitating film release from the substrate. The plated metal makes the 3D structure 100 robust, and makes the coil highly electrically conductive.

Figure 2A:
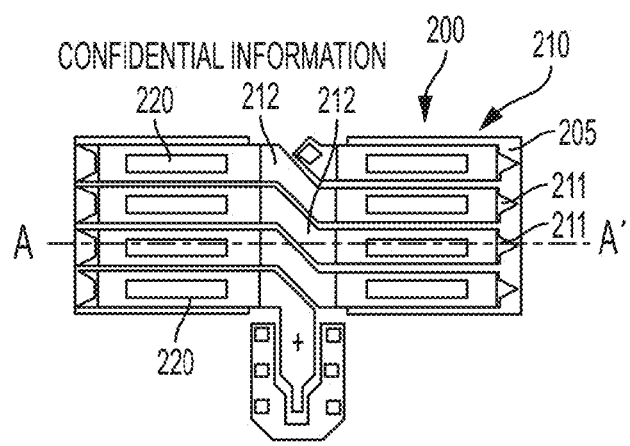
FIGS. 2A through 2G outline a method of making out of plane coil structures in accordance with some embodiments.
Figure 2B:
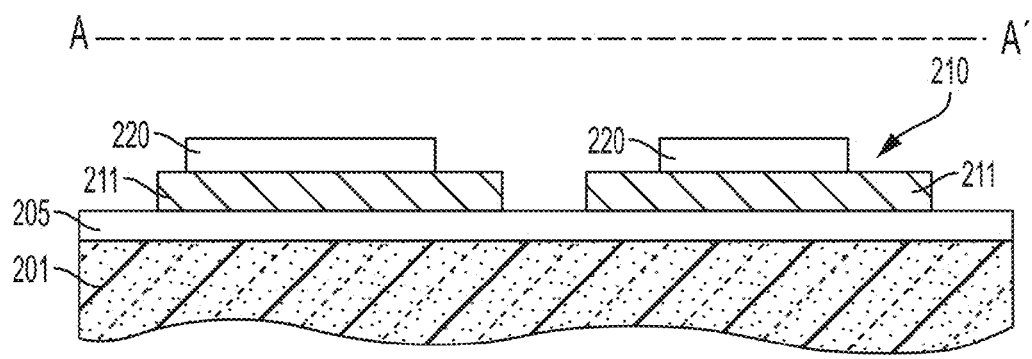

FIGS. 2A through 2G outline a method of making out of plane coil structures in accordance with some embodiments. FIGS. 2A and 2B respectively show top and cross sectional views of a subassembly 200 including a patterned film 210 comprising one or more stress engineered layers 211 disposed on a release layer 205 on a substrate 201. The film 210 can be patterned using standard photolithographic techniques, for example. The substrate 201 may comprise glass, silicon, or other suitable substrate materials. The release layer 205 may be an electrically conductive material, such as titanium. When a conductive release layer is used, the release layer can be used as a ground plane in an electroplating step.

The film 210 includes elastic portions 211 having a non-uniform stress profile through the thickness of the one or more layers of the elastic portions 211 such that the elastic portions curl out of plane with respect to the substrate 201 when released from the substrate 201 as shown in FIG. 2B. Anchor portions 212 of the film 210 are not released and remain attached to the substrate 201 and attach the elastic portions 211 to the substrate 201.

The film 210 is stress-engineered, meaning that the film has a stress gradient, or that the stress in the film varies along the thickness of the film, e.g., from the bottom of the film 210 lying on the release layer 205 to the top of the film 210. The different stress levels in the film 210 can be introduced in multiple sublayers of the film 210 during sputter deposition of the film material onto the release layer 205. The stress levels may be controlled in a variety of ways, including adding a reactive gas to the plasma, depositing the material at an angle, varying the alloy composition of the film material, varying the film material, or changing the pressure of the plasma gas. Another approach to create a stress gradient in the film would be to form the release layer 205 out of a conductive material and use it as an electrode in electroplating different layers having different stress properties to form the film. For example, a first layer may be formed of a first material, such as nickel. A second layer may be formed from a nickel alloy having slighting different chemical makeup resulting in a different stress characteristic for the second layer. Regardless of how the film 210 is formed, the film 210 has characteristic that the elastic portions 211 curl up out of the plane of the substrate 201 when released from the release layer 205 as illustrated in FIG. 2C.

According to some embodiments, load elements 220 are deposited on the elastic portions 211 to control the curvature of the elastic portions 211 when the elastic portions 211 are released. The load elements 220 are additional layers patterned on the elastic portions 211 and that either restrain bending or apply stress that either increases or decreases the bending radius of the elastic portions. Each load element 220 can be patterned to reside generally in the middle segment of an elastic portion 211 in some embodiments.

The load element 220 may made of a reflowable material such as photoresist. The load element 220 toughens elastic portions 211 and lengthens the radius of the released elastic portions 211 in comparison to a similar elastic portion without the resist. The photoresist can be introduced in the same masking step that creates the release window, or it can be introduced in a separate step. The photoresist load element 220 may have very low intrinsic stress when it is processed. Once the elastic portion is released, the photoresist load element 220 is typically on the inside of the bending cantilever, and therefore it accumulates compressive stress upon cantilever release as it opposes the bending. One feature of the photoresist load element 220 is that the loading effect of the resist can be gradually changed with either heat or plasma ashing. Heating the 3D structure 200 softens the photoresist load element 220 and causes the photoresist 220 to flow when at temperatures above its glass transition temperature. The width, length, and/or thickness of the load element 220 can be varied in order to adjust the amount of curvature induced in the released elastic portion 211. The load element can be removed after the 3D structure self-assembles.

Figure 2C:
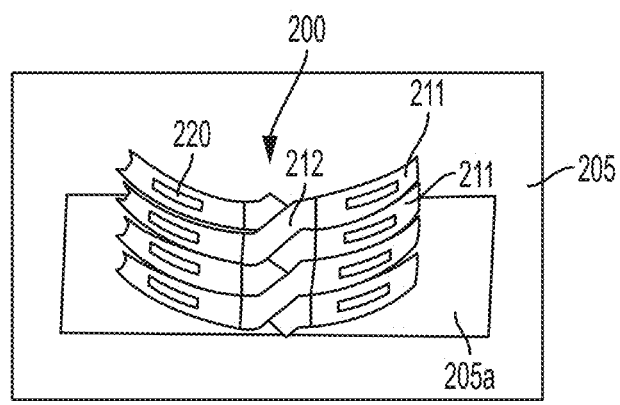
Figure 2D:
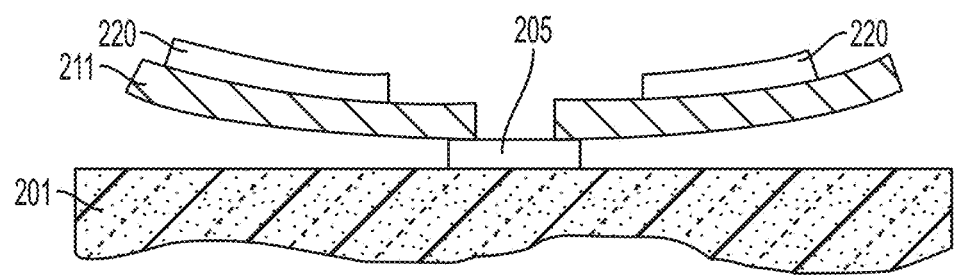
Figure 2E:
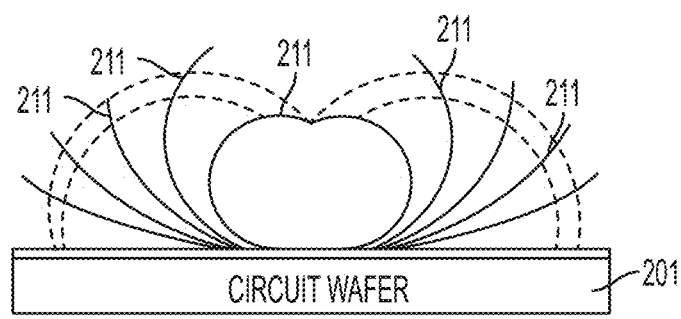
Figure 2F:
Figure 2G:
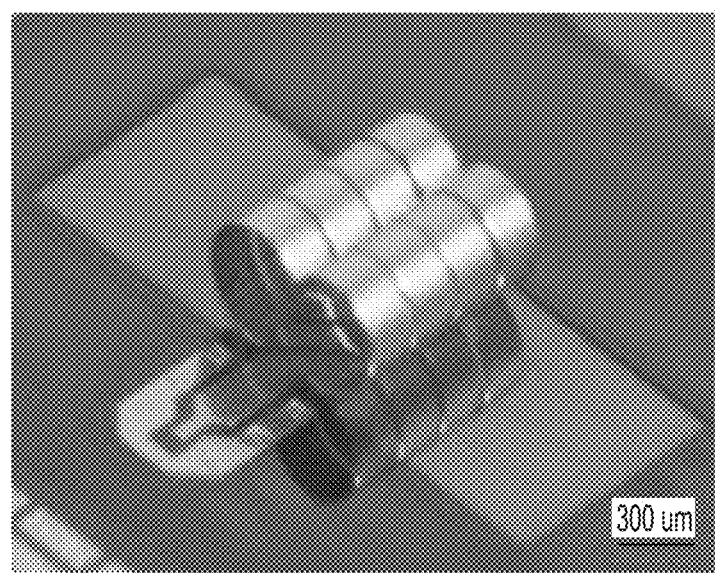

Portions of the release layer 205 can be chemically etched in a release window 205a to release the elastic portions 211 which curl away from the substrate 201 as shown in the perspective view of FIG. 2C and the cross sectional diagram of FIG. 2D. The subassembly 200 is heated as discussed above, to soften the load layers 220, thereby controlling the curling of the elastic portions 211 during the self-assembly process subsequent to film release. FIG. 2E is a cross sectional view depicting self-assembly of the elastic portions 211 after they are released showing the elastic portions 211 in various positions as they are curling away from the substrate. FIG. 2F is a photograph showing the self-assembled 3D structure. FIG. 2G is a photograph that shows the 3D structure after electroplating with Cu. Electroplating with Cu, or other conductive metal, joins the seams where two opposite loops meet, or where the free loop ends meet the anchor portions, making the 3D structure robust and highly electrically conductive. The 3D structure can be fabricated using standard wafer-scale processing techniques and may be batch fabricated on integrated circuit wafers as an add on process. Additional details of fabrication processes of 3D structures are described in U.S. Pat. Nos. 7,713,388, 7,000,315, and 6,646, 533 which are incorporated herein by reference.

Figure 3A:
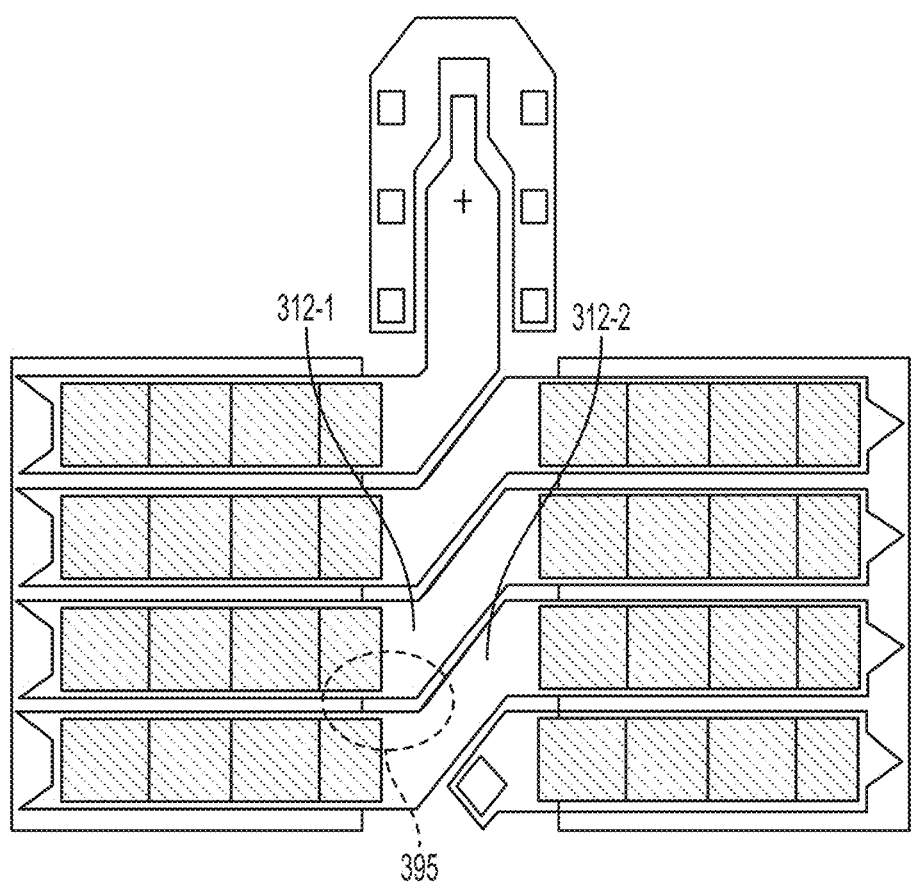
FIG. 3A illustrates a possible location of parasitic plating between anchor portions.
Figure 3B:
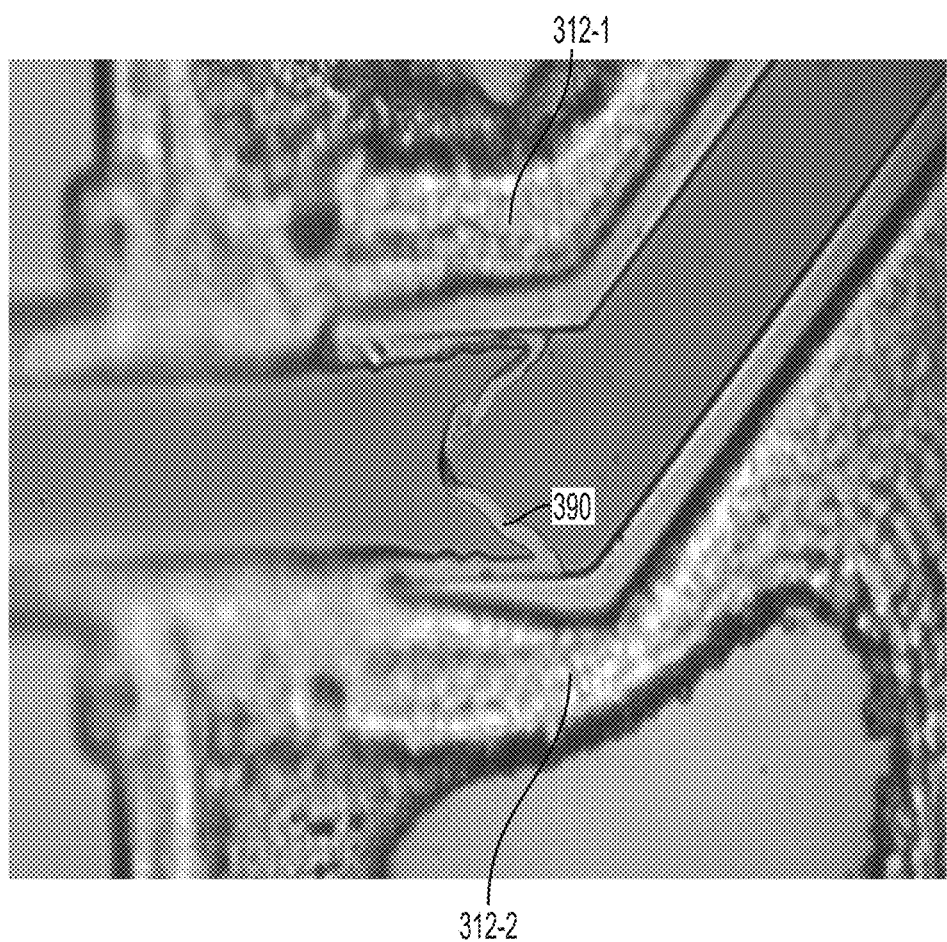
FIG. 3B is a micrograph of a metal bridge formed by parasitic plating.

An issue that can arise during the electroplating process is that unintended metal develops on the substrate between the anchor portions, e.g., near the takeoff locations of the elastic portions. The parasitic plating at the anchor portions can bridge across the space between two neighboring anchor portions causing an electrically short between adjacent coil windings. FIG. 3A illustrates a possible location 395 of the parasitic plating between anchor portions 312-1 and 312-2. FIG. 3B is a photograph of a metal bridge 390 formed by parasitic plating.

Approaches described herein reduce or prevent parasitic plating shorts between anchor regions and widen the processing tolerance for 3D structures. Generally, the metal bridging issue is caused by incomplete sealing of the underlying ground plane from electroplating chemicals during the plating process. FIGS. 4A through 4F show a process sequence illustrating the formation of anchor plating shorts. FIG. 4A shows a patterned stress-engineered film 410 comprising elastic portions 411 and anchor portions 412 disposed on an underlying Ti ground plane 405. The Ti layer 405 not only functions as a release layer for the elastic portions 411, but also functions as a ground plane that electrically connects all components to be plated. During the plating step, a power supply is connected to the ground plane 405, and all components exposed to the plating chemical are batch plated in wafer-scale.

FIG. 4B shows a release window 430 in photoresist 432 that defines where elastic portions would be released. FIG. 4C shows the Ti undercut etch front 431 along the edge of the release window 430 after elastic portions are released (as shown in the photograph of FIG. 2F).

During the electroplating process, metal can form around the perimeter of the undercut etch front 431 because the edge of the Ti underlayer 405 is electrically conducting and exposed to plating chemicals. FIG. 4D illustrates the elastic portions 411 and the anchor portions 412 after plating which produces parasitic plating 433 around the perimeter of the undercut edge front 431. After the plating step, the photoresist 432 is removed (see FIG. 4E) and all exposed Ti ground plane is etched away. FIG. 4F shows the final structure, which incorporates the undesired metal bridge 450 shorting adjacent anchor portions 412.

The metal bridge 450 can be prevented by covering the exposed edge of the titanium underlayer from plating chemicals. One solution to the metal bridge formation involves heating the photoresist 432 to a sufficiently high temperature, causing the photoresist at the undercut edge front 431 to melt and reflow. The intention would be to soften the photoresist so that the softened photoresist would reflow into the undercut region around the Ti undercut edge front 431 and seal the edge 431 against coming into contact with plating chemicals. However this prior approach is problematic because it is unreliable. This approach is very sensitive to how the photoresist is prepared. For example, the photoresist thickness, spin-on process, post-bake temperature, and curing ambient (vacuum or hot plate) all affect the chance for successful completion of the reflow and sealing process. Complete sealing is frequently unsuccessful, and micro-shorts at the anchor regions still form despite effort to seal off the Ti undercut edge. Process unreliability leads to low device yields. Additionally, the prior solution significantly limits the microfabrication process tolerance window because a single process step, wafer heating, is used for sealing the ground plane and for softening the load layers to self-assemble the 3D elastic portions. Both functions must be achieved within the parameter space of that process step.

For example, to achieve sufficient reflow for sealing the Ti undercut edge, the wafer must be heated to above 120° C. However, for a given stress-engineered film stress profile and thickness, such temperatures may be too high for proper 3D assembly of the elastic portions. Upon heating, the trajectory of the elastic portions illustrated in FIG. 2E may continue beyond what is shown, the latching mechanism at the tips of the elastic portions would fail, and the elastic portions would not align to properly form 3D loops. In extreme cases, opposite elastic portions would roll into themselves forming pairs of tightly wound individual circular loops. In this scenario, the film deposition conditions, including ambient pressures and sputter power levels, the film thicknesses, and the mechanical load layer must match the designed stress profile precisely in order for the elastic portions to self-assemble as intended during the photoresist reflow and sealing process. Small drifts in equipment condition and process parameter could cause the coil assembly process to fail. Hence, the temperature constraints for sealing the Ti undercut edge using reflow of the photoresist significantly limit the available parameter space of film deposition conditions for successful fabrication of the 3D structures.

Embodiments described herein overcome the issues stated above and provide a reliable way to prevent plating shorts between the anchor regions. The disclosed approaches widen the process tolerance for fabricating 3D structures. According to some embodiments, the approaches include patterning the electroplating ground plane to open gaps between adjacent the anchor regions. These openings would then be automatically sealed by photoresist during the subsequent step in the microfabrication process. When designed properly, the sealed openings would prevent metal bridges from forming across the anchor regions during the electroplating process. It also decouples the ground plane sealing process from the coil assembly process, thus significantly widening process tolerance for successful coil fabrication.

FIGS. 5A through 5F illustrate an approach for reducing or eliminating shorts between anchor portions that develop during electroplating. As illustrated in FIG. 5A, a stress engineered film 510 comprising one or more layers is deposited over a conductive release layer 505 disposed on a substrate. The stress engineered film 510 is patterned to include elastic portions 511 and anchor portions 512 as previously discussed. The elastic portions 511 curl away from the substrate from the substrate when the release layer is etched beneath them while the anchor portions 512 remain attached to the release layer 505. As illustrated in FIG. 5A, at least one gap 540 is formed in the release layer 505 between neighboring anchor portions 512.

FIG. 5B shows a release window 530 patterned in a photoresist layer 532 disposed on the release layer 505. The release window 530 defines the area where the elastic portions will be released when the release layer is etched. A plug of photoresist 532 at least partially fills the gap 540. FIG. 5C shows the undercut edge front 531 of the release layer 505 after the portion of the release layer 505 in the release window 530 is etched, releasing the elastic portions 511. As depicted in FIG. 5C, there is now no exposed undercut edge between adjacent anchor portions 512 because that region has been replaced with a photoresist plug. The elastic portions 511 and anchor portions 512 are electrically connected by the remaining conductive release layer 505. Electroplating is performed using the release layer as the electroplating ground connection. FIG. 5D shows the structure after the electroplating including parasitic plating 533 that forms along the undercut edge front 531. After electroplating, the photoresist is stripped (FIG. 5E), and all exposed release layer 505 is removed (FIG. 5F). As illustrated in FIG. 5F, electroplated stubs 541 are present between anchor portions. The stubs 541 extend partially across the distance between the anchor portions but do not electrically connect the adjacent anchor portions 512. The stubs are electroplated remnants of the release layer for the elastic portions. As shown in FIG. 5F, the stubs 541 lie in the x-y plane of the substrate, bending away from the anchor portions 512 along the y-axis, e.g., the stubs 541 bend upward in the orientation shown in FIG. 5F. In some scenarios, a photoresist artifact is discernable on the substrate between the anchor portions as a faint outline around the release region that shows the shape of the etching undercut below the photoresist mask during device fabrication. The photoresist artifact is caused by remaining residues from the release layer 505 after the release layer 505 is removed as in the step shown in FIG. 5F and described above. The residues are embedded into the material below the release layer 505.

According to the process outlined in FIGS. 5A through 5F, a conductive metal bridge between adjacent anchor portions is prevented in a well-controlled and reliable manner. If desired, the parasitic plated metal trace 533 around the perimeter of the release window 530 can be similarly eliminated. The same method of opening appropriate seal windows release layer can be employed around the anticipated etch front of the undercut. The seal window or gap between adjacent springs may be designed so it extends by a distance which is sufficiently deep into the anchor region. Otherwise, the release layer undercut edge 531 could advance beyond the bottom 541 of the gap 540 during the spring release. For example, the gaps may extend along the x direction in FIG. 5A at least about 50% of a distance between the neighboring anchor portions 512 and/or may extend along the y direction at least about 50% of the length of the anchor portions. The distance along the x direction between neighboring anchor portions 512 can less than about 100 µm in some embodiments.

On-chip out-of-plane coil structures produced in accordance with the invention have numerous practical applications. For example, when produced with inductance values in the range of 1 to 100 nH, the out-of-plane inductor coil structures are optimally suited for use in mobile RF communication devices that operate in a frequency range of approximately 100 MHz to several GHz. In addition to their use as inductors, the out-of-plane coils can also be used as transformers. Micro-transformers are used in electronic components such as mixers, double-tuned filters and RF signal transformers. The out-of-plane coils are compatible with a variety of micro-transformer architectures. Examples of micro-transformer designs using the out-of-plane coils are described in the U.S. Pat. Nos. 6,856,225 and 6,392,524 which are incorporated herein by reference. Out-of-plane structures made in accordance with the embodiments disclosed herein may be used in any circuit formed on a substrate.

Figure 6A:
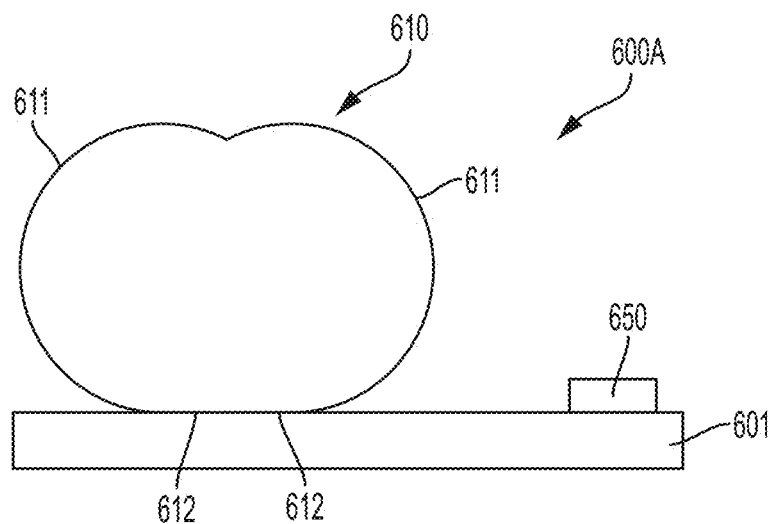
FIGS. 6A and 6B provide cross sectional diagrams of circuit systems in accordance with some embodiments.

FIG. 6A provides a cross sectional diagram a circuit system 600A in accordance with some embodiments. The circuit system 600A includes one or more electronic components 650 disposed on the circuit substrate 601. An electrically conductive three dimensional structure, e.g., a 3D coil, is electrically coupled to at least one of the electronic components 650. The three dimensional 1 structure 610 includes a film comprising one or more stress engineered layers that include elastic portions 611 having a non-uniform stress profile through the thickness of the one or more layers such that the elastic portions 611 are curled into a three dimensional shape. Anchor portions 612 attach the elastic portions 611 to the circuit substrate 601. An outer conductive layer is disposed, e.g., by electroplating, over the elastic portions 611 and the anchor portions 612. One or more conductive stubs (shown in FIG. 5F) extend between two adjacent anchor portions 612 without electrically connecting the two adjacent anchor portions 612. Electrical connections between the 3D structure and electronic component 650 may be made by conductive traces disposed on the surface of and/or within the circuit substrate 601.

Figure 6B:
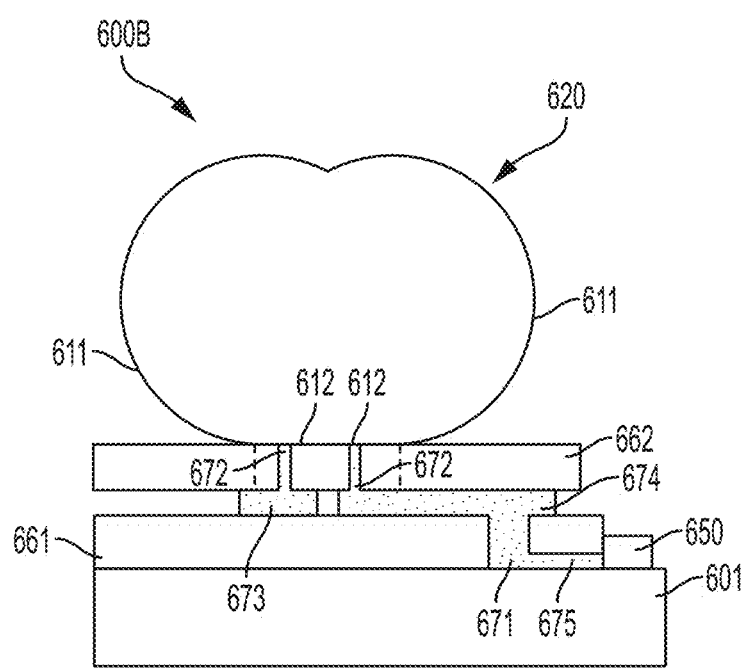

FIG. 6B shows another embodiment of a circuit system 600B that includes a 3D structure 620 electrically coupled to electronic components 650. The circuit system 600B includes additional interlayers 661, 662 and conductive routing structures 671, 672, 673, 674, 675 that may be used for interconnecting the 3D structure 620 and electronic components 650. The interlayers 661, 662 are dielectric layers disposed between the three dimensional structure 620 and the circuit substrate 601. Interlayer 661 is disposed on the substrate 601 and may comprise a dielectric such as $SiO_2$, SiON, SiN, for example. Interlayer 662 may comprise a low loss tangent material such as benzocyclobutene (BCB).

Routing trace metal layers 673, 674 are disposed between the interlayers 671 and 672. Routing trace metal layer 675 is disposed on the circuit substrate. The trace metal layers 673, 674, 675 can comprises multiple sublayers, e.g., evaporated and/or plated metal sections. Vias 612 connect the 3D coil 620 to the routing traces 673, 674. Routing trace 675 is connected to the electronic component 650. Via 671 interconnects the routing trace 675 routing traces 673, 674.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A device comprising:
   a substrate;
   a film comprising one or more stress engineered layers, the film comprising:
      elastic portions that are curled out of plane with respect to the substrate; and
      anchor portions that attach the elastic portions and to the substrate;
   an outer conductive layer disposed over the elastic portions and the anchor portions; and
   one or more electrically conductive stubs that extend between two adjacent anchor portions without electrically connecting the two adjacent anchor portions.

2. The device of claim 1, further comprising a photoresist artifact disposed on the substrate between the anchor portions.

3. The device of claim 1, wherein the stubs are electroplated remnants of a release layer for the elastic portions.

4. The device of claim 3, wherein the stubs bend away from the anchor portions.

5. A circuit system comprising:
   a circuit substrate;
   one or more electronic components disposed on the circuit substrate;
   an electrically conductive three dimensional structure electrically connected to at least one of the electronic components, the three dimensional structure comprising:
      a film comprising one or more stress engineered layers, the film comprising:
         elastic portions curled into a three dimensional shape; and
         anchor portions attached to the elastic portions; and
      an outer conductive layer disposed over the elastic portions and the anchor portions; and
   one or more conductive stubs that extend between two adjacent anchor portions without electrically connecting the two adjacent anchor portions.

6. The system of claim 5, further comprising one or more dielectric interlayers disposed between the three dimensional structure and the circuit substrate.

7. The system of claim 6, wherein the one or more dielectric interlayers include:
   a first dielectric interlayer disposed on the circuit substrate; and
   a second dielectric interlayer; and
   further comprising:
   electrically conductive traces routed between one or both of the first interlayer dielectric and the second interlayer dielectric, the electrically conductive traces electrically connecting at least one of the electronic components to the three dimensional structure.

8. A method for forming a three dimensional structure comprising:
   depositing a stress engineered film over a conductive layer, the stress engineered film including:
      elastic portions having a non-uniform stress profile through the thickness of the one or more layers such that the stress engineered film curls when released from the conductive layer; and
      anchor portions configured to remain attached to the conductive layer;
   forming gaps in the conductive layer between neighboring anchor portions;
   depositing a mask layer defining one or more release windows;
   etching the conductive layer in the release windows, the etching releasing the elastic portions of the stress engineered film such that the elastic portions curl to form the three dimensional structure; and
   electroplating the three dimensional structure using the conductive layer as a contact for the electroplating.

9. The method of claim 8, wherein depositing the mask layer comprises depositing mask material within the gaps.

10. The method of claim 9, wherein the mask material substantially fills the gaps in the conductive layer.

11. The method of claim 8, wherein the elastic portions of the stress engineered film curl to form three dimensional coil loops.

12. The method of claim 11, wherein the three dimensional coil loops form loops of a three dimensional inductor.

13. The method of claim 8, further comprising forming load elements on the elastic portions.

14. The method of claim 13, further comprising removing the load elements after releasing the elastic portions.

15. The method of claim 13, further comprising heating the three dimensional structure after releasing the elastic portions.

16. The method of claim 15, wherein the heating softens the load elements and controls the curling of the elastic portions during the heating.

17. The method of claim 15, wherein heating the three dimensional structures comprises heating at less than about 120 degrees C.

18. The method of claim 8, wherein the curling of the elastic portions comprises engaging interlocking features disposed at tips of the elastic portions.

19. The method of claim 8, wherein the gaps extend at least 50% of a distance between the neighboring anchor portions.

20. The method of claim 8, wherein the gaps extend at least 50% of a length of the anchor portions.

21. The method of claim 8, wherein a distance between neighboring anchor portions is less than about 100 µm.

22. The method of claim 8 further including removing the mask layer after the electroplating.

23. The method of claim 22 further including removing the conductive layer after removing the mask layer.

* * * * *